United States Patent [19]

Sato et al.

[11] Patent Number: 4,743,840
[45] Date of Patent: May 10, 1988

[54] DIAGNOSING METHOD FOR LOGIC CIRCUITS

[75] Inventors: Yoshio Sato; Toshifumi Ishii; Shun Ishiyama, all of Hadano, Japan

[73] Assignees: Hitachi Computer Engineering Co., Ltd., Kanagawa; Hitachi, Ltd., Tokyo, both of Japan

[21] Appl. No.: 935,259

[22] Filed: Nov. 26, 1986

[30] Foreign Application Priority Data

Nov. 26, 1985 [JP] Japan .................................. 60-263743

[51] Int. Cl.$^4$ ............................................. G01R 31/00
[52] U.S. Cl. ........................................ 324/73 R; 371/3
[58] Field of Search ............ 324/73 R, 73 AT; 371/3, 371/24, 25

[56] References Cited

U.S. PATENT DOCUMENTS

| | | | |
|---|---|---|---|
| 4,107,649 | 8/1978 | Kurihara | 371/3 |
| 4,267,463 | 5/1981 | Mayumi | 324/73 R |
| 4,567,593 | 1/1986 | Bashaw | 324/73 AT |
| 4,602,210 | 7/1986 | Fasang et al. | 324/73 R |
| 4,625,313 | 11/1986 | Springer | 371/24 |
| 4,630,270 | 12/1986 | Petit et al. | 371/25 |

FOREIGN PATENT DOCUMENTS 0095369 5/1985 Japan .............................. 324/73 AT

OTHER PUBLICATIONS

"On-Wafer and On-Module Chip Testing", by Joni, IBM Tech. Disc. Bull., vol. 26, #8, 1/84, pp. 4312-4323.
"Checking of Check Circuitry", by Baron et al, IBM Tech. Disc. Bull, vol. 11, #11, 4/69, pp. 1398-1399.

Primary Examiner—Reinhard J. Eisenzopf
Assistant Examiner—W. Burns
Attorney, Agent, or Firm—Antonelli, Terry & Wands

[57] ABSTRACT

In a logic circuit which is logically divided into partial circuits each consisting of a logic block, data holding stages on the input and output sides therof, and a scan circuit segment associated with them, diagnostic data for a logic circuit section is obtained using the scan circuit segments in the respective partial circuits and wherein, only the scan circuit segments in the respective partial circuits are actuated to set values in the output side data holding stages and to read out the contents thereof as diagnostic test data for a scan circuit section.

9 Claims, 2 Drawing Sheets

DIAGNOSING METHOD FOR LOGIC CIRCUITS

BACKGROUND OF THE INVENTION

The present invention relates to the testing of logic circuits and, more particularly, to a method for testing a logic circuit which has a built-in scan circuit for a diagnosis.

A logic circuit of a scale larger than a certain degree is constructed of a plurality of logic blocks (each block including a plurality of combinational logic circuit stages) which are interconnected through data holding stages (such as flip-flops or latches). The logic circuit of a specified type which is formed as an LSI or which is mounted on a printed circuit board is ordinarily provided with a scan circuit which directly controls the respective data holding stages in order to set diagnostic input data and to read out diagnostic output data, and the logic block and the scan circuit are activated during exclusive time periods with respect to each other, in other words, so that while one is operating, the other is kept in an non-operating state, by a signal which is applied to a scan enable edge pin.

According to a prior-art method for diagnosing or testing the logic circuit of the above type, as described in Japanese Patent Application Laid-open No. 60-102021, the entire circuit is logically divided into partial circuits each consisting of one of the logic blocks, an input side data holding stage and an output side data holding stage thereof, and a scan circuit segment associated with them. Subsequently, in each of the partial circuits, the scan circuit segment is actuated to set diagnostic input data in the input side data holding stage, and then the operation of the scan circuit segment is inhibited while the logic block is actuated. Thereafter the output of the logic block set in the output side data holding stage is read out as diagnostic data. Although this method is intended to obtain the diagnostic data for the logic circuit section composed of the logic blocks and the data holding stages, it cannot produce diagnostic data for the scan circuit section (including the various edge pins connected to the scan circuit). Therefore, if the scan circuit section is faulty, a correct diagnosis cannot be drawn from the diagnostic data obtained in the foregoing way. Accordingly, satisfactory diagnostic data cannot be produced without the diagnostic data for the scan circuit section also.

SUMMARY OF THE INVENTION

An object of the present invention is to provide a method of collecting overall diagnostic data which includes diagnostic data for the scan circuit section also when testing a logic circuit which has a built-in diagnostic scan circuit.

According to the present invention, in a testing method for gathering diagnostic data for a logic circuit comprising partial circuits each consisting of a logic block, an input side and an output side data holding stages thereof, and a scan circuit segment associated with them for gathering the diagnostic data, there is also included, in addition to the steps of diagnosing the logic circuit section as in the prior art, the step of gathering diagnostic data for the scan circuit section by actuating only the scan circuit segments in the respective partial circuits so as to set data in and read out the data from the data holding stages.

Since the logic blocks do not operate during the operation of the scan circuit segments, the diagnostic data for the scan circuit section can be produced by this additional step. Since the scan circuit section accounts for 20 to 30% of the whole logic circuit, enhancement in the percentage of fault detection equal, at least, to that extent can be expected.

The aforementioned and other objects, features and advantages of the present invention will become apparent from the following description.

DETAILED DESCRIPTION

Figure 1:
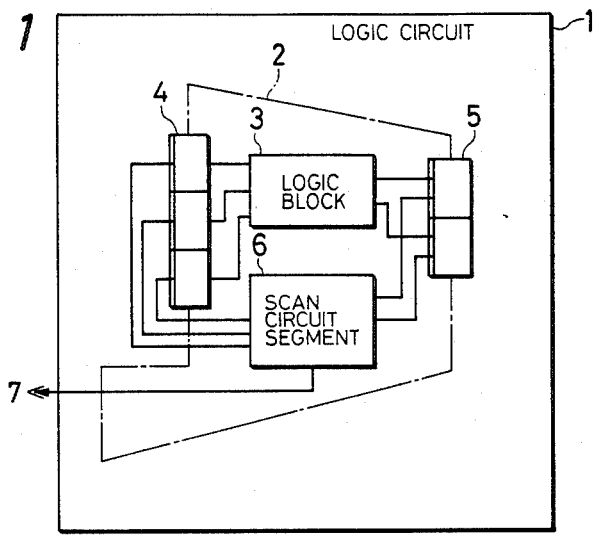
FIG. 1 is a block diagram schematically showing the whole logic circuit which is to be tested according to the present invention.

FIG. 1 conceptually shows an example of a logic circuit which is to be tested according to the present invention. A rectangle 1 denotes the whole logic circuit which is formed as an LSI or which is mounted on a printed circuit board. This logic circuit is logically divided into a plurality of partial circuits 2 (only one of which is shown in the figure) for the diagnostic purpose. Each partial circuit 2 consists of a logic block 3 made up of combinational logic circuits, an input side flip-flop stage (referred to as "input FF stage" hereinafter) 4, an output side flip-flop stage (referred to as "output FF stage" hereinafter) 5, and a scan circuit segment 6 associated with them. When a scan enable edge pin 7 is at a value "0", the scan circuit segment 6 is in the non-operating state thereof and the logic block 3 is in the operating state thereof, whereas when the scan enable edge pin 7 is at a value "1", the scan circuit segment 6 is in the operating state and the logic block 3 is in the non-operating state. During the normal mode of operation, the value "0" is applied to the scan enable edge pin 7, whereby the scan circuit segment 6 is inhibited from operating, and the logic block 3 subjects the content of the input FF stage 4 to a logical operation and sets the result of the operation in the output FF stage 5.

Figure 2:
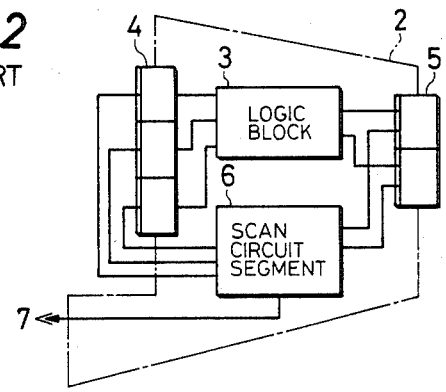
FIG. 2 is a block diagram schematically showing a partial circuit which is formed for testing a logic circuit section according to the prior art.

FIG. 2 shows the partial circuit 2 which is formed for the testing of the logic cirucit section according to the aforementioned prior-art method. The input FF stage 4 is used as an input terminal point (an input value setting point), while the output FF stage 5 is used as an output terminal point (an output value observing point). First, the value "1" is applied to the scan enable edge pin 7 to actuate the scan circuit segment 6, whereby predetermined diagnostic input data is set, or scanned-in, in the input FF stage 4. Subsequently, the value "0" is applied to the scan enable edge pin 7, thereby inhibiting the operation of the scan circuit segment 6 and actuating the logic block 3. The logic block 3 sets the result of a logical operation based on the content of in input FF stage 4, in the output FF stage 5. The content of the output FF stage 5 is extracted, or scanned-out, as diagnostic data by again applying the value "1" to the scan enable edge pin 7 to operate the scan circuit segment 6. If the scan circuit segment 6 continues to operate during the operation of the logic block 3, the content of the input FF stage 4 might change as a result of a charge on the input terminal point by the scan circuit segment. In such a case, the testing operation may be based on data different from the designated diagnostic input data that may result in an improper diagnostic data read-out. In order to avoid this difficulty, the operation of the logic block 3 and that of the scan circuit segment 6 are activated during exclusive time periods with respect to each other. However, the faults (especially "stuck-at-0" and "stuck-at1") of the scan circuit segment 6 itself cannot be detected from the diagnostic data thus obtained as the result of the operation of the logic block 3.

Figure 3:
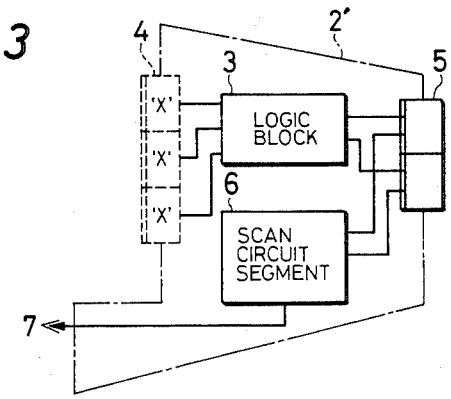
FIG. 3 is a block diagram schematically showing a partial circuit which is formed for testing a logic circuit section according to the present invention.

FIG. 3 shows the partial circuit 2' which is formed for diagnosis of the scan circuit section according to the present invention. The value "1" is applied to the scan enable edge pin 7 to bring the scan circuit segment 6 into the operating state and the logic block 3 into the non-operating state. The input FF stage 4 is treated as a group of indeterminate value (hazard) inserting elements e.g. flip-flops. Accordingly, even when the scan circuit segment 6 is actuated, any specified value is not set in the input FF stage 4. This disposal for the input FF stage 4 precludes the input FF stage from being adversely affected by the scan circuit element diagnostic data and resulting in the reduction in the quantity of diagnostic input data. The scan circuit segment 6 scans diagnostic input data into the output FF stage 5 and scans the content out of the same, thereby producing diagnostic data. This diagnostic data is useful particularly for the detection of the stuck faults of the scan circuit section.

Figure 4:
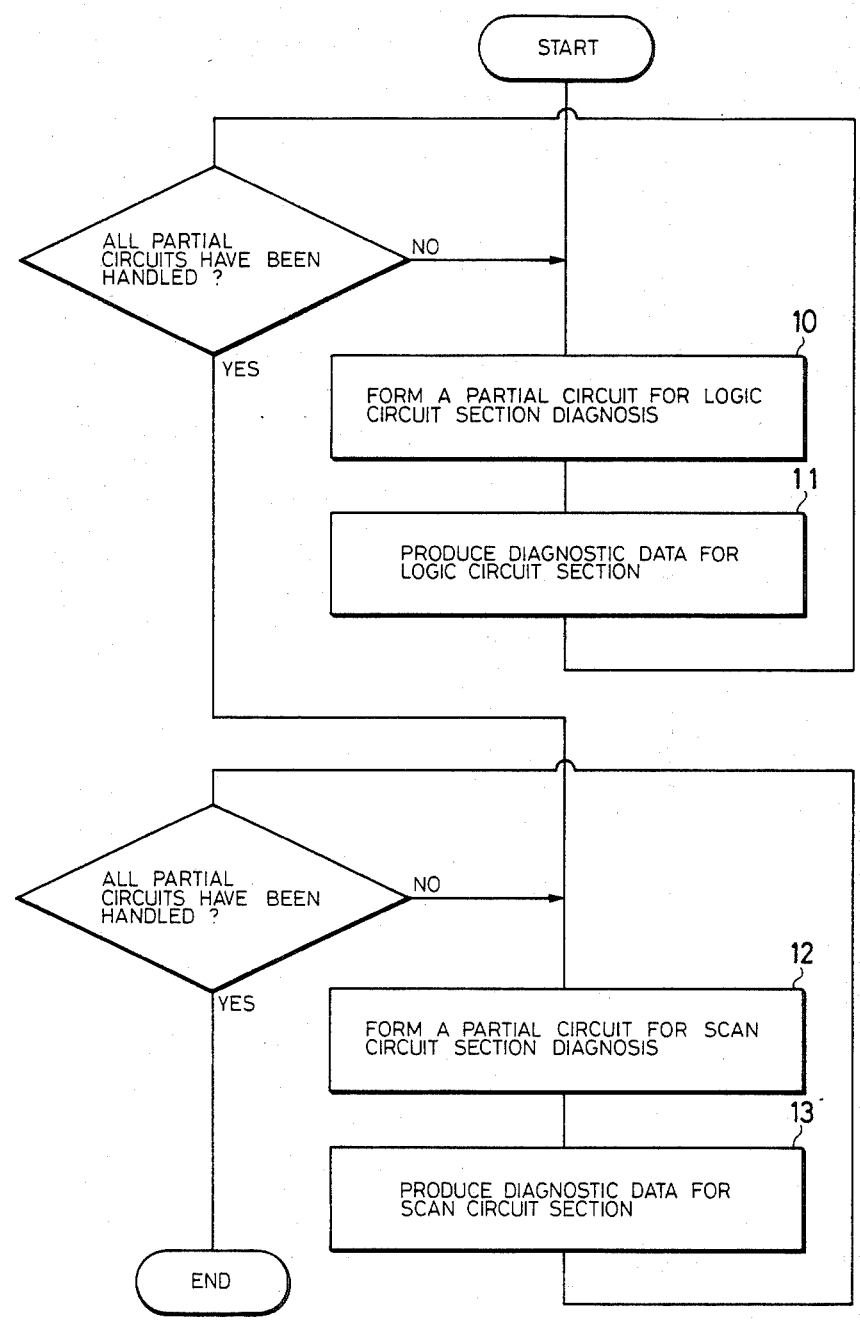
FIG. 4 is a flow chart showing a diagnosing process in an embodiment of the present invention.

FIG. 4 is a flow chart showing an example of a diagnosing process according to the present invention. Steps 10 and 11 correspond to the diagnosis of the logic circuit section based on the prior-art method. At the step 10, a single partial circuit 2 as shown in FIG. 2 is formed. At the step 11, diagnostic data for the logic block 3 and the input and output FF stages 4, 5 in this partial circuit is produced. These steps are repeated for the successive partial circuits, whereby diagnostic data for the whole logic circuit section in the circuit 1 to be tested are collected.

Subsequently, the diagnosis of the scan circuit section forming the characterizing feature of the present invention is made. At a step 12, a single partial circuit 2' as shown in FIG. 3 is formed. At a step 13, diagnostic data for the scan circuit segment 6 in this partial circuit is produced as described before. These steps are repeated for the successive partial circuits, whereby diagnostic data for the whole scan circuit section are collected. In this way, complete diagnostic data for the whole circuit 1 (both the logic circuit section and the scan circuit section) to be tested are obtained.

Either the collection of the diagnostic data for the entire logic circuit section or that of the diagnostic data for the entire scan circuit section may well be performed first, or one may well be directly followed by the other for each of the partial circuits.

What we claim is:

1. In a method for testing a logic circuit which comprises a plurality of partial circuits each including a logic block having an input side and an output side, an input side data holding stage including a plurality of circuit elements for holding information data received and being operatively connected to said logic block input side for transmitting the information thereto, an output side data holding stage including at least one circuit element operatively connected to said logic block output side for receiving and holding information data therefrom and a scan circuit segment associated with and operatively connected in each partial circuit for inputting and outputting diagnostic data, the improvement comprising the steps of:
within each partial circuit, actuating the scan circuit segment and inhibiting operation of the logic block;
scanning-in predetermined diagnostic input data directly into said output side data holding stage by said scan circuit segment while maintaining any information data that may be present at the input side data holding stage circuit elements and its condition thereof as indeterminate;
reading out the content of the output side data holding stage via said scan circuit segment as diagnostic data for said scan circuit segment; and
repeating the above said steps until all of said partial circuits have been diagnosed.

2. A method for testing a logic circuit which comprises a plurality of partial circuits each including a logic block having an input side and an output side, an input side data holding stage for storing information data received and being operatively connected to said logic block input side for transmitting the information thereto, an output side data holding stage operatively connected to said logic block output side for receiving and storing the information data therefrom and a scan circuit segment associated with and operatively connected in each partial circuit for inputting and outputting diagnostic data, including diagnosing each of said partial circuits, wherein the improvement comprising the steps of:
actuating the scan circuit segment and inhibiting operation of the logic block;
setting predetermined diagnostic input data directly into said output side data holding stage by said scan circuit segment, while maintaining any information data that may be present at the input side data holding stage and its condition thereof as indeterminate; and
reading out the content of the output side data holding stage via said scan circuit segment as diagnostic data for said scan circuit segment.

3. In a method for testing a logic circuit which comprises a plurality of partial circuits each including a logic block having an input side and an output side, an input side data holding stage for holding information data received and being operatively connectd to said logic block input side for transmitting the information thereto, an output side data holding stage operatively connected to said logic block output side for receiving and holding the information data therefrom and a scan circuit segment associated with and operatively connected in each partial circuit for inputting and outputting diagnostic data, including in each of said partial circuits the steps of actuating the scan circuit segment and setting predetermined diagnostic data in said input side data holding stage, inhibiting the operation of said scan circuit segment and activating said logic block so that it becomes responsive to the diagnostic data content in said input data holding stage, placing the logic block operational result in the output side data holding stage and scanning-out the content in said output side data holding stage as diagnostic data for the logic block and holding stages, wherein the improvement comprises the further steps of:

within each partial circuit actuating said scan circuit segment and inhibiting operation of said logic block;

scanning-in diagnostic input data directly into said output side data holding stage by said scan circuit segment while maintaining any information data that may be present at the input data holding stage and its condition thereof as indeterminate; and reading out the content of the output side data holding stage via said scan circuit segment as diagnostic data for said scan circuit segment.

4. A method for testing a logic circuit according to claim 3, wherein the entire logic circuit section, corresponding to the logic blocks and the respective input side and output side data holding stages in said plurality of partial circuits, is diagnosed first followed by diagnosing the entire scan circuit section, corresponding to the scan circuit segments in said plurality of partial circuits.

5. A method for testing a logic circuit according to claim 3, wherein the entire scan circuit section, corresponding to the scan circuit segments in said plurality of partial circuits is diagnosed first followed by diagnosing the entire logic circuit section, corresponding to the logic blocks and the respective input side and output side data holding stages in said plurality of partial circuits.

6. A method for testing a logic circuit according to claim 3, wherein each partial circuit is individually tested by testing the respective logic circuit segment, including the logic block in conjunction with the input side and output side data holding stages as well as the scan circuit segment therein until said entire plurality of partial circuits are tested.

7. A method for testing a logic circuit according to claim 1, wherein the input side data holding stage in respective partial circuits is used as the output side data holding stage of an adjacent partial circuit and the output side data holding stage in each of said respective partial circuit is used as the input side data holding stage of a different adjacent partial circuit.

8. A method for testing a logic circuit according to claim 2, wherein the input side data holding stage in respective partial circuits is used as the output side data holding stage of an adjacent partial circuit and the output side data holding stage in each of said respective partial circuits is used as the input side data holding stage of a different adjacent partial circuit.

9. A method for testing a logic circuit according to claim 3, wherein the input side data holding stage in respective partial circuits is used as the output side data holding stage of an adjacent partial circuit and the output side data holding stage in each of said respective partial circuits is used as the input side data holding stage of a different adjacent partial circuit.

* * * * *